United States Patent [19]
Ophey

[11] Patent Number: 5,500,846
[45] Date of Patent: Mar. 19, 1996

[54] RADIATION SOURCE-DETECTION UNIT EMPLOYING A GRATING HAVING TWO GRATING STRUCTURES, AND A DEVICE INCLUDING THAT UNIT

[75] Inventor: Willem G. Ophey, Eindhoven, Netherlands

[73] Assignee: U.S. Philips Corporation, New York, N.Y.

[21] Appl. No.: 174,869

[22] Filed: Dec. 29, 1993

[30] Foreign Application Priority Data

Jan. 4, 1993 [EP] European Pat. Off. ............... 93200002

[51] Int. Cl.$^6$ ........................................ G11B 7/00
[52] U.S. Cl. ...................... 369/116; 369/112; 369/44.14
[58] Field of Search ....................... 369/116, 103, 369/109, 112, 44.11, 44.14, 44.12, 44.37, 44.38, 120, 121; 359/566, 569–575

[56] References Cited

U.S. PATENT DOCUMENTS

| | | | |
|---|---|---|---|
| 4,358,200 | 11/1982 | Heemskerk et al. | 356/123 |
| 4,665,310 | 5/1987 | Heemskerk et al. | 250/201 |
| 4,924,079 | 5/1990 | Opheij et al. | 250/201.5 |
| 5,212,572 | 5/1993 | Krantz et al. | 369/103 X |
| 5,233,595 | 8/1993 | Kawakubo | 369/116 |

FOREIGN PATENT DOCUMENTS

| | | | |
|---|---|---|---|
| 0372629 | 6/1990 | European Pat. Off. | |
| 1112534 | 5/1989 | Japan . | |
| 0193333 | 7/1990 | Japan | 369/109 |
| 3-8385 | 1/1991 | Japan . | |
| 0189935 | 8/1991 | Japan | 369/44.23 |
| 0032032 | 2/1992 | Japan | 369/109 |

Primary Examiner—Andrew L. Sniezek
Assistant Examiner—Thang V. Tran
Attorney, Agent, or Firm—Richard A. Weiss

[57] ABSTRACT

A device for scanning a surface includes a radiation source, a transparent plate provided with a grating having two grating structures, an objective system for focusing the radiation beam on a surface, and a detection system for converting radiation reflected by the surface into electric signals. The first grating structure in the grating is intended, for example, for forming two side beams from the radiation beam. By providing the second grating structure, a monitor beam is obtained in reflection from the radiation beam. The monitor beam is directed onto a monitor detector which generates an electric signal with which the radiation power of the radiation source is controlled.

19 Claims, 3 Drawing Sheets

RADIATION SOURCE-DETECTION UNIT EMPLOYING A GRATING HAVING TWO GRATING STRUCTURES, AND A DEVICE INCLUDING THAT UNIT

BACKGROUND OF THE INVENTION

The invention relates to a device for optically scanning a surface, such a device comprises a radiation source-detection unit and a focusing unit for focusing radiation supplied by the radiation source-detection unit on a surface. The radiation source-detection unit includes a radiation source for supplying a radiation beam, a grating having a first grating structure for forming at least a deflected sub-beam from the radiation beam supplied by the radiation source or from a beam reflected by the surface, a radiation-sensitive detection system for converting radiation reflected by the surface into electric signals, an element for forming a monitor beam from the beam supplied by the radiation source, and a monitor detector for converting the monitor beam into an electric signal for controlling the radiation source. The invention also relates to a radiation source-detection unit for use in such a device.

A device of the type described in the opening paragraph is known from European Patent Application No. 0 372 629, which corresponds to U.S. Pat. No. 4,924,079. That device can be used for scanning a record carrier by means of a radiation beam. A three-spot grating is placed in the radiation beam of the device. In transmission, this grating forms two first-order diffracted sub-beams from the radiation beam. Together with the on-going non-deflected main beam, the two sub-beams are focused by an objective system to three spots on the record carrier. The main spot formed by the main beam is used for writing or reading information in the tracks of the record carrier. The side spots formed by the side beams are used for generating a tracking signal with which a circuit is controlled which keeps the main spot on the track to be scanned.

When information is being written in the record carrier, it is desirable that the power in the main beam is maintained accurately at a given value, referred to as the write power. To this end a reflector is arranged around the grating, which reflector reflects a part of the radiation from the radiation source falling outside the grating, referred to as the border radiation, to a monitor detector arranged beside the radiation source. The signal from the monitor detector is subsequently used for controlling the power supplied by the radiation source. A drawback is that the ratio between the border radiation power and the main beam power is dependent on the radiation source used, so that the monitor detector must be calibrated for each device.

SUMMARY OF THE INVENTION

It is an object of the present invention to provide a device for optically scanning a surface which does not have the above-mentioned drawback. To this end a device according to the invention is characterized in that the monitor beam-forming element is a second grating structure in the grating and in that the monitor beam is radiation reflected by the grating. The monitor beam is formed from the same part of the radiation beam as the part from which the grating forms the main beam. Consequently, the power in the monitor beam is a fixed fraction of the power in the main beam. The output signal of the monitor detector is then a direct measure of the power in the main beam so that it is no longer necessary to calibrate. By giving the two grating structures a given, mutual orientation, the direction of this beam can be made approximately equal to the direction of the main beam to be captured by the radiation-sensitive detection system. This provides the possibility of integrating the monitor detector with the detection system so that the device can be made in a simpler manner and at lower cost.

It is to be noted that it is known from Japanese Patent Application JP-A 3-8385 to provide a grating in the housing of a diode laser, which grating reflects a part of the radiation from the radiation source to a monitor detector. This publication does not state that this unit of radiation source and monitor diode can be used in a scanning device and that the grating can be integrated with another grating and the monitor diode can be integrated with other signal photodiodes.

An embodiment of the device according to the invention is characterized in that the first grating structure has a grating groove depth which is approximately equal to half the wavelength of the radiation and in that the second grating structure is blazed for preferential diffraction in the direction of the monitor detector. By choosing half a wavelength for the depth of the first grating structure, measured at the air side of the grating, this grating structure reflects little radiation from the source in diffraction beams. This, in turn, yields a high transmission for the radiation towards the surface to be scanned. The invention is based on the recognition that the reflection of the second grating structure is still sufficiently large to obtain sufficient radiation on the monitor diode, provided, by means of an operation referred to as "blazing" of the second grating structure, this radiation is concentrated as much as possible into a beam of one diffraction order.

The modified grating also forms beams which are diffracted by the two grating structures in a first or a higher order. Such beams only cause loss of radiation. This radiation is reduced in a device according to the invention which is characterized in that the grating grooves of the first grating structure are substantially perpendicular to the grating grooves of the second grating structure. The deviation from perpendicular is preferably smaller than 30°. The combination of this measure with the choice of the depth of the grating grooves and blazing of the first and second grating structures results in an even more effective suppression of these beams.

A particular embodiment of the device according to the invention is characterized in that the second grating structure has optical power. Due to the optical power, the monitor beam is focused on the monitor detector so that the monitor detector may be small.

Another embodiment of the device according to the invention is characterized in that the first grating structure is a linear grating structure for forming a non-deflected main beam and two side beams deflected in opposite directions from the radiation beam supplied by the source, and in that the detection system has a separate detector for each of the three beams reflected by the surface. The first grating structure generates, in transmission, the two sub-beams which, in the form of two side beams at both sides of the main beam, are formed by the objective system to two side spots at both sides of the main spot. The radiation reflected by these side spots is detected by means of the detection system in order to derive a signal indicating the extent to which the main spot correctly tracks the track to be scanned.

Still another embodiment of the device according to the invention is characterized in that the first grating structure is adapted to deflect a radiation beam reflected by the surface towards the detection system and to deform the deflected beam in such a way that a focus error signal can be derived therefrom by means of the detection system. A special grating structure can introduce astigmatism into the deflected beam so that a focus error signal in accordance with the astigmatic method can be generated with this beam. Two sub-beams, from which a focus error signal can also be generated by means of the Foucault method, can be generated with a different grating structure.

BRIEF DESCRIPTION OF THE DRAWINGS

These and other aspects of the invention will be apparent from and elucidated with reference to the embodiments described hereinafter and the following drawings, in which.

DETAILED DESCRIPTION OF THE PREFERRED EMBODIMENT

Figure 1:
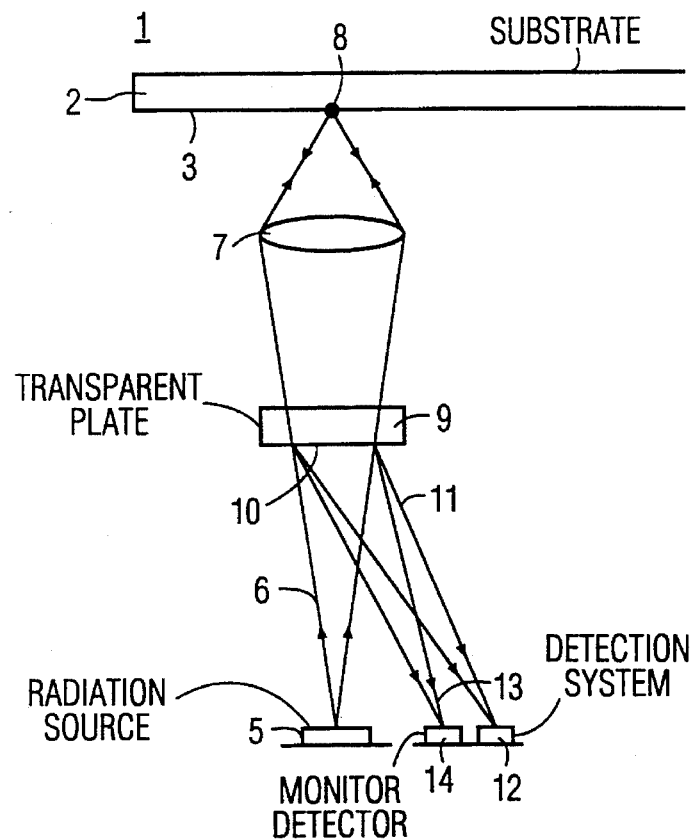
FIG. 1 shows a first embodiment of the device according to the invention.

FIG. 1 shows a device for scanning an optical record carrier 1, a part of which is shown in a cross-section. The record carrier comprises a substrate 2 provided with a reflecting recording layer 3. In the configuration shown the recording layer is scanned from the air side; it is, however, preferred to scan the recording layer through the then transparent substrate. The information on the recording layer is ordered in tracks which are not shown in the Figure. A radiation source 5, for example a semiconductor laser, supplies a radiation beam 6 which is focused by an objective system 7 on the recording layer 3 to form a spot 8 for scanning the recording layer. It must be possible to detect the beam reflected by the recording layer and modulated by the information structure, for which purpose this beam must be separated from the ongoing beam. To this end the device can be provided in a known manner with a transparent plate 9 provided with a grating 10 which is dimensioned in such a way that it passes the reflected beam substantially in a given diffraction order. The sub-beam 11 thus formed and deflected is captured by a detection system 12 which converts the sub-beam into one or more electric signals, for example an information signal, a tracking error signal and a focus error signal. The tracking error signal and the focus error signal are used in servocircuits (not shown) for controlling the position of the spot 8 in such a way that it remains in the recording plane and continues to track the track to be scanned.

The grating 10 may have a first grating structure with straight grating grooves. Due to a special curvature of the grating grooves, inter alia known from U.S. Pat. No. 4,358,200, the deflected sub-beam 11 can be made astigmatic. If the detection system 12 has four detectors arranged in quadrants, onto whose center the sub-beam 11 is directed, a focus error signal can be derived from the output signals of the four detectors in accordance with the astigmatic method as described in the United States Patent. In another embodiment, known from U.S. Pat. No. 4,665,310, the grating 10 has two sub-gratings at both sides of a dividing line, in which each sub-grating has a series of substantially parallel grating grooves, while the grating grooves of the first sub-grating extend at a first angle and those of the second sub-grating extend at a second, for example equally large but with opposite angle to the dividing line. The two sub-gratings of such a (Foucault) grating each form a sub-beam from the radiation reflected by the recording plane. These sub-beams, which have different directions, are incident on separate detector pairs of the detection system. The output signals of these detectors are processed to produce a focus error signal. This detection method is known as the Foucault method.

For measuring the power in the spot 8 on the recording layer 3, the structure of the grating 10 is modified in accordance with the invention in such a way that the part of the on-going radiation beam 6 reflected by the grating is deflected into a diffracted monitor beam 13. A monitor detector 14 converts this beam into a control signal which is used for maintaining the power supplied by the radiation source at a desired value.

The new grating is composed of a first grating structure for deflecting and possibly diffracting the servobeam 11 into a shape suitable for focus detection, on which first grating structure a second grating structure for forming the monitor beam 13 is superimposed. The grating grooves of the second grating structure may be curved to give the structure an optical power. Due to this power, a converging monitor beam 13 is formed from the diverging radiation beam 6. The average angle between the grating grooves of the first and second grating structures is preferably approximately 90° in order to reduce the interference between the two grating structures and to enhance the possibility of manufacturing the grating. In that case, the monitor detector 14 is arranged in front of or behind the radiation source 5, viewed in a direction perpendicular to the plane of the drawing in FIG. 1.

Figure 2:
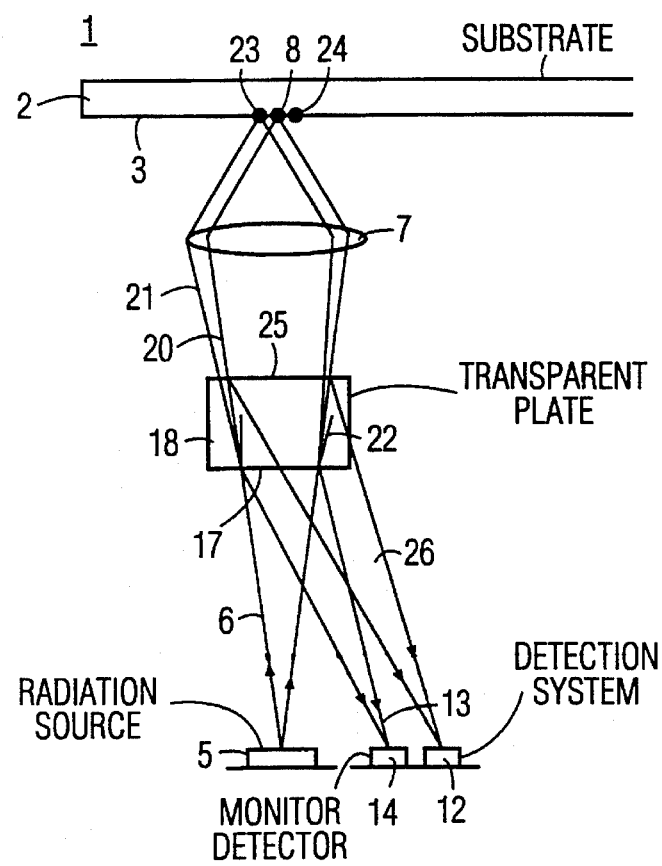
FIG. 2 shows a second embodiment of the device according to the invention.

FIG. 2 shows another embodiment of the device according to the invention. The radiation beam 6 from the radiation source 5 is split into a non-deflected main beam 20 and two deflected side beams 21, 22 by a grating 17 arranged on a transparent plate 18. For the sake of clarity, only one of the side beams 21 is shown completely in the Figure. The grating 17 has a first grating structure, which is known as a three-spot grating, having substantially equidistant, straight grating grooves. The objective system 7 focuses the main beam 20 and side beams 21, 22 formed by this grating structure to a main spot 8 and two side spots 23, 24, respectively, on the recording layer 3. A second grating 25 deflecting a substantial part of the radiation reflected by the recording layer as beam 26 to a servodetection system 12 is arranged on the plate 18. This second grating 25 may have approximately the same grating structure as the first grating structure in the grating 10 of FIG. 1. An information signal as well as a focus error signal can be derived in accordance with either the astigmatic or the Foucault method from the signals supplied by the detection system 12. FIG. 2 only shows the deflected reflected main beam 26. The grating 25 also deflects the reflected side beams 21 and 22 towards the detection system. This system comprises two extra detectors for converting the reflected and deflected side beam radiation into electric signals from which a tracking error signal can be derived. For further information about reading information and about the systems for tracking and/or focusing, reference is made to said European Patent Application No. 0 372 629.

According to the invention, the grating 17 in the device shown in FIG. 2 is modified in such a way that the reflected part of the radiation beam is deflected into a monitor beam 13. The power in the monitor beam is proportional to the power generated by the radiation source. The monitor beam is incident on a monitor detector 14 which converts the incident radiation into an electric signal for controlling the radiation power of the radiation source 5. The modification of the grating involves combining the first grating structure with a second grating structure. The second grating structure comprises a collection of grating grooves which may be curved. The curvature gives the grating structure an optical power so that the monitor beam 13 is a converging beam. The grating grooves of the first grating structure preferably extend in a direction which is perpendicular to the average direction of the grating grooves of the second grating structure. In contrast to what is shown in FIG. 2, the side beams 21, 22 are then substantially deflected in a direction perpendicular to the plane of the drawing. The distances between the side spots 23, 24 and the main spot 8 on the recording layer 3 will therefore be larger in the direction perpendicular to the plane of the drawing than the distances between the side spots and the main spot in the plane of the drawing. The positions of the monitor detector 14 and the part of the detection system 12 intended for the beam 26 remain unchanged so that these elements can be advantageously integrated, as is also the case for these elements in FIG. 1.

Figure 3:
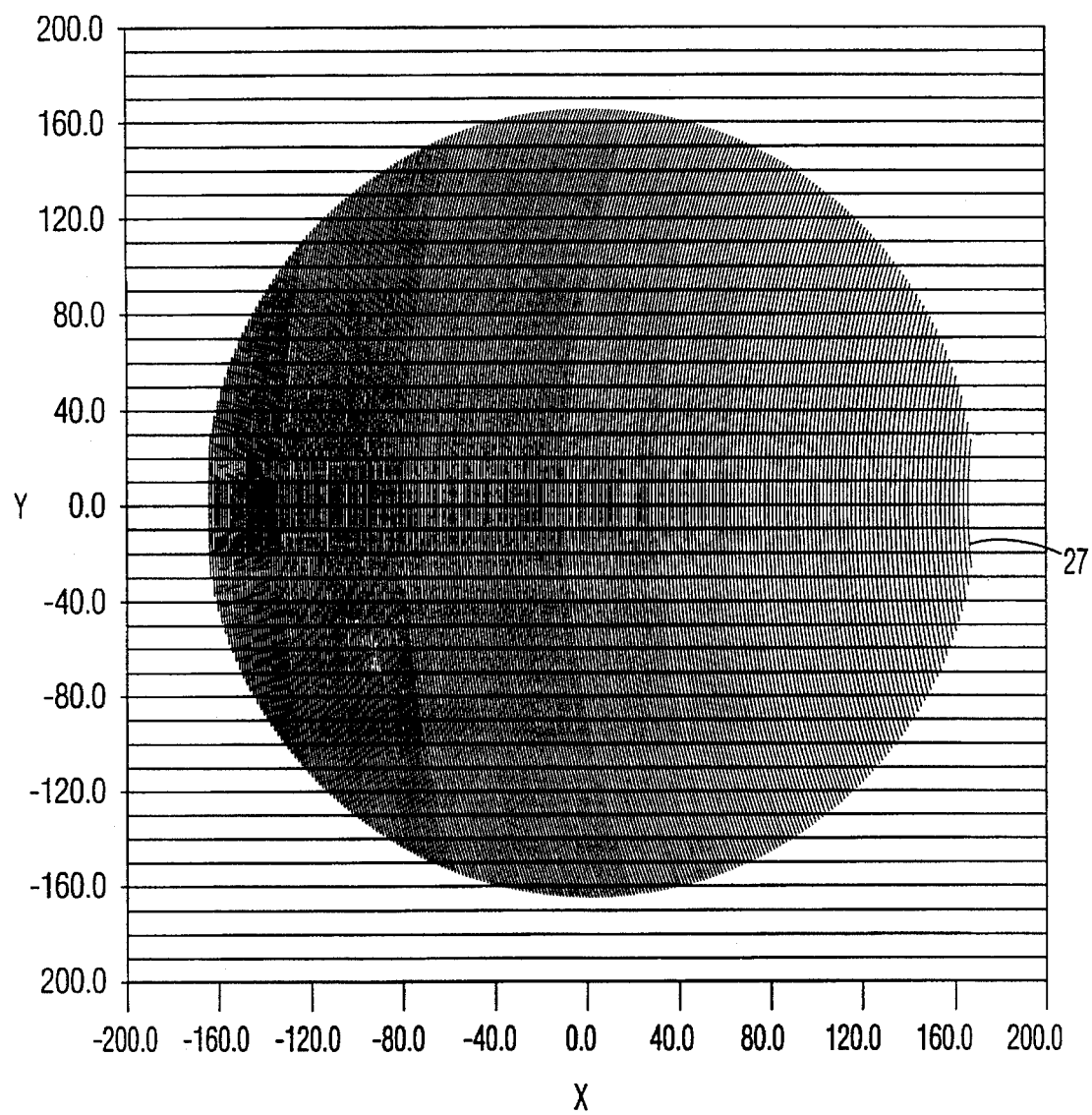
FIG. 3 is a bottom view of a grating used in the device of FIG. 2.

FIG. 3 is an elevational view of an embodiment of the grating 17, viewed from the side of the radiation source 5. The numbers along the axes X, Y in the Figure indicate distances in micrometers. The horizontal lines in the Figure represent the first grating structure having a period of, for example 10 μm. Each period consists of a groove having a rectangular cross-section and a width of 5 μm and an intermediate strip having a width of 5 μm as well. The substantially vertical lines in the Figure represent the second grating structure whose period across the grating diameter varies from, for example, 1 μm to, for example, 2 μm. The second grating structure has, for example, a sawtooth-shaped profile. The objective system 7 has such a position and dimensions such that the radiation of the radiation source 5 falling within the circular boundary 27 of the second grating structure and being passed is also passed by the objective system and focused to the spots 8, 23, 24 on the recording layer 3. For the sake of clarity, the horizontal lines of the first grating structure extend beyond the boundary 27. Since the monitor beam originates from the grating area within the boundary 27, the monitor beam comprises a fraction of that part of the radiation beam 6 which is used for forming the spots. Consequently, the part of the radiation beam 6 falling outside the boundary 27 is not measured. The power measured by the monitor detector 14 is thus a good measure of the power in the spots.

Figure 4:
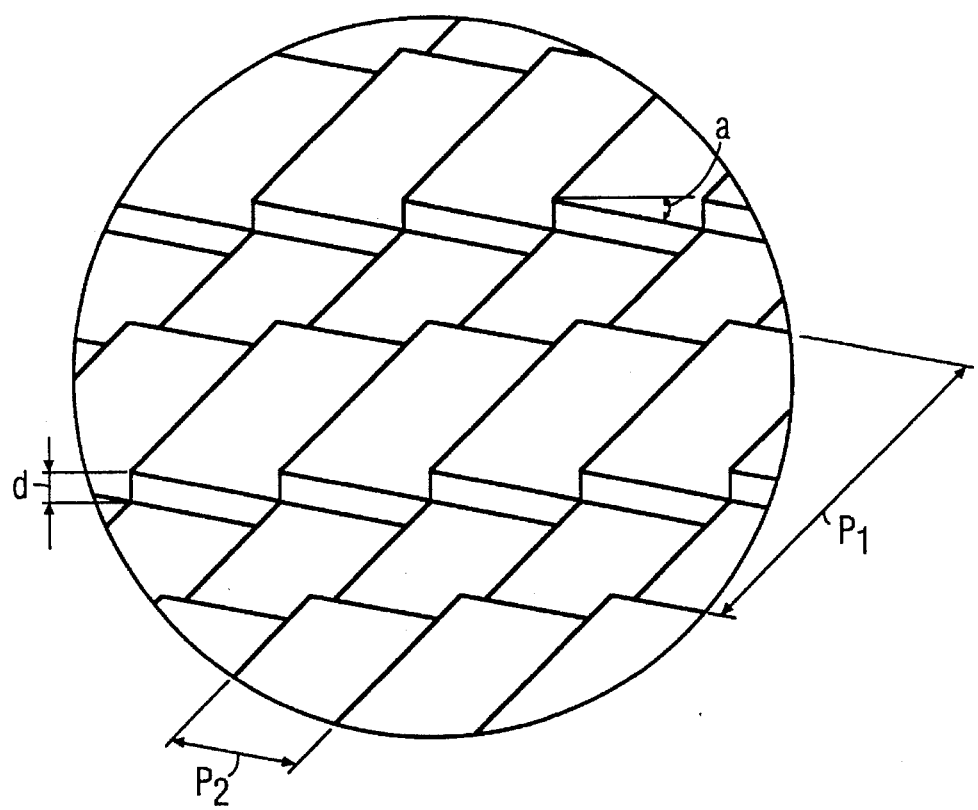
FIG. 4 is a side elevation of a detail of the grating.

FIG. 4 is an oblique elevational view of a magnification of a part of the grating 17 in which the first and second grating structures can be clearly distinguished. In the grating embodiment shown, the depth of the grooves of the first grating structure is equal to that of the second grating structure. The period of the first grating structure is denoted by $p_1$, and the period of the second grating structure is denoted by $p_2$. Dependent on the wavelength and the direction of the incident radiation, the period of a grating structure determines the direction of the deflected radiation. If this grating is arranged in the device of FIG. 2, the reflected part of the radiation beam 6 will be diffracted in a first order towards the monitor detector 14 due to the chosen period of the second grating structure. The radiation reflected by the recording layer 3 is diffracted in transmission by the second grating structure. Since, in transmission, there is a refractive index transition from the material of the plate 18 to air, the angle at which the diffracted beam exits from the grating 17 will be different than the angle at which the monitor beam 13 leaves the grating. Consequently, the radiation reflected by the record carrier does not generate any focused beams which are located very close to the monitor beam 13, which might detrimentally influence the measurement of the power in the monitor beam by the monitor detector 14.

In an embodiment of the device shown in FIG. 2, in which the plate 18 is provided at one side with the grating 17 and at the other side with a grating 25 in the form of a Foucault grating, the detection system 12 has two detector pairs which are arranged at some distance from each other in a direction perpendicular to the plane of the drawing. In the case of a given positioning of the gratings 17 and 25 with respect to each other, the diffraction beams of the grating 17 will form radiation spots between the two detector pairs in the direction of the monitor detector 14. Diffraction beams, which may be present beside the monitor beam 13, will thus not influence the detection of one or more sub-beams 11 by the detection system 12.

The depth of the grating grooves of the first grating structure in FIG. 4 is denoted by d. If this depth, measured in air, is approximately equal to half the wavelength of the radiation, combined with an approximately equal width of the grooves and the intermediate strips, only little radiation from the source 5 will be reflected by the first grating structure in diffraction beams. Since the second grating structure preferably diffracts the incident radiation in the monitor beam 13, the radiation diffracted in reflection by the grating 17 will largely be deflected in the monitor beam 13 towards the monitor detector 14. The angle between the long side of the sawtooth profile of the second grating structure and the plane of the grating is denoted by α in FIG. 4. The angle α is also referred to as blaze angle. By suitable choice of the blaze angle, the power of the monitor beam 13 diffracted in a given order may be increased at the expense of the other beams (not shown) which are diffracted in different orders by the second grating structure. Preferably, there is a small variation of the blaze angle across the diameter of the second grating structure so as to obtain a satisfactory focusing of the monitor beam 13 on the monitor detector 14. The power of the side beams 21, 22 with respect to the main beam 20 can be determined by means of the groove depth and the ratio between the width of these grooves and the intermediate strips of the first grating structure.

Figure 5:
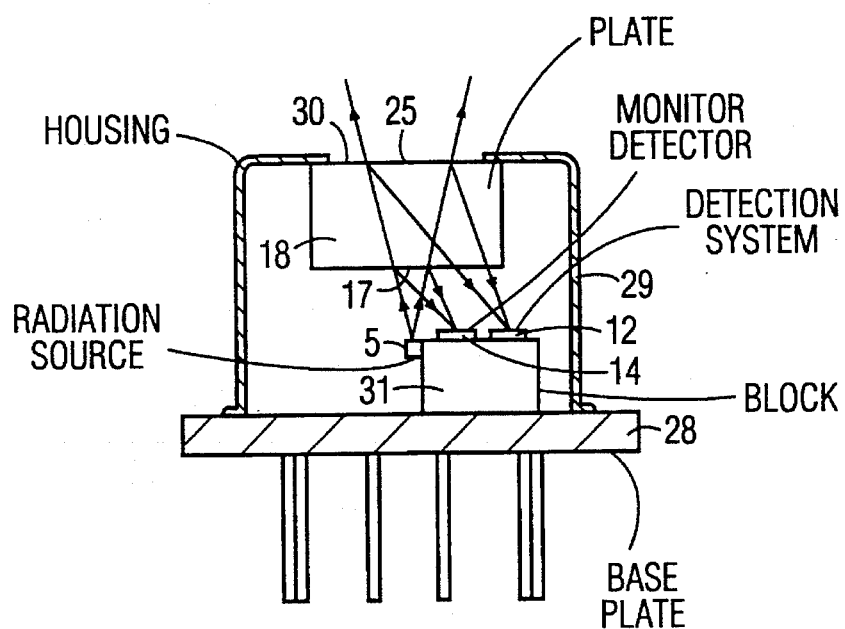
FIG. 5 shows a radiation source-detection unit.

The plate 18 with the gratings, the radiation source 5, the detection system 12 and the monitor detector 14 can be integrated in one radiation source-detection unit, as is shown in FIG. 5. The unit has a base plate 28 through which electric connections have been made. A cylindrical housing 29 having an aperture 30 at its upper side is mounted on the base plate. The inner side of the transparent plate 18 is secured to the aperture. The radiation source 5 in the form of a semiconductor laser is mounted on a block 31. The monitor detector 14 and the detection system 12 are also mounted on the block. A possible difference in height between the radiation source and the radiation-sensitive surface of the detectors can be compensated for by giving the second grating structure in the grating 17 and the second grating 25 a slightly different optical power. Some measures of a given embodiment of the radiation source-detection unit are: thickness of the plate 18:3 mm; distance between the radiation source 5 and the plate: 1.5 mm; distance between the radiation source and the center of the monitor detector 14: 1 mm; distance between the radiation source and the center of the detection system 12: 1.5 mm.

In a possible method of manufacture of the grating 10 or 17, the fine, blazed second grating structure is first provided in the plate 9 or 18 by means of the following steps: providing a lacquer layer on the plate, exposing the lacquer layer with a pattern in accordance with the second grating structure, developing the lacquer layer to the desired depth and converting the exposure pattern into a profile in the material of the plate by means of reactive ion etching. After removal of the lacquer residues, the coarser, first grating structure is provided by means of the following steps: providing a lacquer layer on the plate at the area of the second grating structure, exposing the lacquer layer with a pattern in accordance with the first grating structure, developing the lacquer layer, lowering the parts of the second grating structure corresponding to the grooves of the first grating structure to the desired depth by means of reactive ion etching, and removing the lacquer residues.

The invention may be used advantageously in all types of devices for writing, reading and/or erasing in optical record carriers in which the information is recorded in the form of, for example pits, of areas having a different reflection coefficient than their surroundings, such as those which are formed in phase-change materials, or of magnetic domains. The described grating 17 having the two grating structures may be further used in all devices for scanning surfaces by means of a radiation beam. Such a surface need not be a recording surface in an optical record carrier, but it may be any arbitrary surface to be examined.

I claim:

1. A device for optically scanning a surface, the device comprising:

focussing means for focusing a radiation beam on the surface; and a radiation source-detection unit including:

a radiation source for supplying the radiation beam;

a grating having a first grating structure for forming at least a deflected beam from the radiation beam or from radiation reflected by the surface, and a second grating structure for forming a monitor beam from radiation reflected by said second grating structure, the first and second grating structures being located throughout substantially the same area;

a radiation-sensitive detector system for converting the radiation reflected by the surface into electric signals; and a monitor detector for converting the monitor beam into an electrical signal for controlling said radiation source.

2. The device as claimed in claim 1, wherein said first grating structure has a grating groove depth which is approximately equal to half the wavelength of the radiation beam, and said second grating structure is blazed for preferential diffraction in the direction of said monitor detector.

3. The device as claimed in claim 2, wherein said first and second grating structures each have grating grooves, and the grating grooves of said first structure are substantially perpendicular to the grating grooves of said second grating structure.

4. The device as claimed in claim 3, wherein said second grating structure has optical power.

5. The device as claimed in claim 3, wherein said first grating structure is a linear grating structure for forming a non-deflected main beam and two side beams deflected in opposite directions from the radiation beam, and said detection system has a separate detector for three beams of radiation reflected by the surface.

6. The device as claimed in claim 3, wherein said first grating structure is adapted to deflect a beam of radiation reflected by the surface towards said detection system and to deform the deflected beam in such a way that a focus error signal can be derived therefrom by said detection system.

7. The device as claimed in claim 2, wherein said second grating structure has optical power.

8. The device as claimed in claim 7, wherein said first grating structure is a linear grating structure for forming a non-deflected main beam and two side beams deflected in opposite directions from the radiation beam, and said detection system has a separate detector for three beams of radiation reflected by the surface.

9. The device as claimed in claim 7, wherein said first grating structure is adapted to deflect a beam of radiation reflected by the surface towards said detection system and to deform the beam in such a way that a focus error signal can be derived therefrom by said detection system.

10. The device as claimed in claim 2, wherein said first grating structure is a linear grating structure for forming a non-deflected main beam and two side beams deflected in opposite directions from the radiation beam, and said detection system has a separate detector for three beams of radiation reflected by the surface.

11. The device as claimed in claim 2, wherein said first grating structure is adapted to deflect a beam of radiation reflected by the surface towards said detection system and to deform the beam in such a way that a focus error signal can be derived therefrom by said detection system.

12. The device as claimed in claim 1, wherein said first grating structure is a linear grating structure for forming a non-deflected main beam and two side beams deflected in opposite directions from the radiation beam, and said detection system has a separate detector for three beams of radiation reflected by the surface.

13. The device as claimed in claim 1, wherein said first grating structure is adapted to deflect a beam of radiation reflected by the surface towards said detection system and to deform the beam in such a way that a focus error signal can be derived therefrom by said detection system.

14. A radiation source-detection unit, comprising:

a radiation source for supplying a radiation beam which is focussed on a surface;

a grating having a first grating structure for forming at least a deflected beam from the radiation beam or from radiation reflected by the surface, and a second grating structure for forming a monitor beam from radiation reflected by said second grating structure, the first and second grating structures being located throughout substantially the same area;

a radiation-sensitive detector system for converting the radiation reflected by the surface into electric signals; and a monitor detector for converting the monitor beam into an electrical signal for controlling said radiation source.

15. The detection unit as claimed in claim 14, wherein said first grating structure has a grating groove depth which is approximately equal to half the wavelength of the radiation beam, and said second grating structure is blazed for preferential diffraction in the direction of said monitor detector.

16. The detection unit as claimed in claim 15, wherein said first grating structure has grating grooves which are substantially perpendicular to grating grooves of said second grating structure.

17. The detection unit as claimed in claim 15, wherein said second grating structure has optical power.

18. The detection unit as claimed in claim 14, wherein said first grating structure is a linear grating structure for forming a non-deflected main beam and two side beams deflected in opposite directions from the radiation beam, and said detection system has a separate detector for three beams of radiation reflected by the surface.

19. The detection unit as claimed in claim 14, wherein said first grating structure is adapted to deflect a beam of radiation reflected by the surface towards said detection system and to deform the beam in such a way that a focus error signal can be derived therefrom by said detection system.

* * * * *